US008986451B2

(12) United States Patent
Sferlazzo (10) Patent No.: US 8,986,451 B2
(45) Date of Patent: Mar. 24, 2015

(54) LINEAR BATCH CHEMICAL VAPOR DEPOSITION SYSTEM

(75) Inventor: Piero Sferlazzo, Marblehead, MA (US)

(73) Assignee: Singulus MOCVD GmbH I. GR., Kahl am Main (DE)

( * ) Notice: Subject to any disclaimer, the term of this patent is extended or adjusted under 35 U.S.C. 154(b) by 603 days.

(21) Appl. No.: 12/787,082

(22) Filed: May 25, 2010

(65) Prior Publication Data

US 2011/0293831 A1 Dec. 1, 2011

(51) Int. Cl.
*C23C 16/00* (2006.01)
*C23C 16/458* (2006.01)
*C23C 16/455* (2006.01)
*C23C 16/52* (2006.01)
*H01L 21/67* (2006.01)
*H01L 21/677* (2006.01)
*H01L 21/687* (2006.01)

(52) U.S. Cl.
CPC ....... *C23C 16/4584* (2013.01); *C23C 16/45565* (2013.01); *C23C 16/45578* (2013.01); *C23C 16/52* (2013.01); *H01L 21/67109* (2013.01); *H01L 21/67784* (2013.01); *H01L 21/68771* (2013.01)
USPC ............ 118/719; 118/724; 118/725; 118/729

(58) Field of Classification Search
USPC ........ 118/719, 728, 500; 156/345.31, 345.32, 156/345.33, 345.34
See application file for complete search history.

(56) References Cited

U.S. PATENT DOCUMENTS

| 3,602,192 | A | * | 8/1971 | Grochowski et al. | ......... 118/719 |
| 3,805,736 | A | * | 4/1974 | Foehring et al. | .............. 118/715 |
| 4,262,131 | A | * | 4/1981 | Sih | ................................. 560/53 |
| 4,579,080 | A | * | 4/1986 | Martin et al. | ................. 118/730 |

(Continued)

FOREIGN PATENT DOCUMENTS

JP     1050613 A    2/1998
KR  1020040046042 A    6/2004

OTHER PUBLICATIONS

International Search Report and Written Opinion in counterpart international patent application No. PCT/US2011/036167 dated Jan. 9, 2012; 10 pages.

(Continued)

*Primary Examiner* — Gordon R Baldwin
*Assistant Examiner* — Charlee Bennett
(74) *Attorney, Agent, or Firm* — Schmeiser, Olsen & Watts LLP (57) ABSTRACT

Described is a linear batch CVD system that includes a deposition chamber, one or more substrate carriers, gas injectors and a heating system. Each substrate carrier is disposed in the deposition chamber and has at least one receptacle configured to receive a substrate. The substrate carriers are configured to hold substrates in a linear configuration. Each gas injector includes a port configured to supply a gas in a uniform distribution across one or more of the substrates. The heating system includes at least one heating element and a heating control module for uniformly controlling a temperature of the substrates. The system is suitable for high volume CVD processing of substrates. The narrow width of the deposition chamber enables a uniform distribution of precursor gases across the substrates along the length of the reaction chamber and permits a greater number of substrates to be processed in comparison to conventional deposition chambers.

19 Claims, 6 Drawing Sheets

(56) References Cited

U.S. PATENT DOCUMENTS

| | | | | |
|---|---|---|---|---|
| 4,823,736 | A * | 4/1989 | Post et al. | 118/730 |
| 5,119,760 | A * | 6/1992 | McMillan et al. | 118/722 |
| 5,366,554 | A * | 11/1994 | Kanai et al. | 118/715 |
| 5,788,777 | A * | 8/1998 | Burk, Jr. | 118/730 |
| 5,958,140 | A | 9/1999 | Arami et al. | |
| 6,197,121 | B1 * | 3/2001 | Gurary et al. | 118/715 |
| 6,416,579 | B1 | 7/2002 | Thallner | |
| 6,578,515 | B2 * | 6/2003 | Sakamoto et al. | 118/723 I |
| 6,843,892 | B1 * | 1/2005 | McLeod | 118/500 |
| 6,886,244 | B1 * | 5/2005 | McLeod et al. | 29/831 |
| 7,041,202 | B2 * | 5/2006 | McLeod | 204/192.12 |
| 7,153,368 | B2 * | 12/2006 | Preti et al. | 118/728 |
| 8,303,713 | B2 | 11/2012 | Belousov et al. | |
| 2002/0033133 | A1 * | 3/2002 | Klein et al. | 118/500 |
| 2002/0069827 | A1 | 6/2002 | Sakamoto et al. | |
| 2003/0061989 | A1 * | 4/2003 | Kamimura et al. | 118/712 |
| 2003/0072882 | A1 | 4/2003 | Niinisto et al. | |
| 2004/0067641 | A1 * | 4/2004 | Yudovsky | 438/680 |
| 2006/0126701 | A1 | 6/2006 | Nozawa et al. | |
| 2006/0144335 | A1 * | 7/2006 | Lee et al. | 118/719 |
| 2007/0077355 | A1 | 4/2007 | Chacin et al. | |
| 2008/0213477 | A1 | 9/2008 | Zindel et al. | |
| 2008/0251020 | A1 * | 10/2008 | Franken et al. | 118/730 |
| 2009/0017190 | A1 | 1/2009 | Sferlazzo et al. | |
| 2009/0042394 | A1 * | 2/2009 | Yamazaki et al. | 438/694 |
| 2009/0098276 | A1 | 4/2009 | Burrows et al. | 427/8 |
| 2012/0219713 | A1 * | 8/2012 | Sferlazzo et al. | 427/255.28 |
| 2013/0270362 | A1 * | 10/2013 | Sferlazzo et al. | 239/225.1 |

OTHER PUBLICATIONS

Sferlazzo, Piero et al.; "Web Substrate Deposition System"; U.S. Appl. No. 12/466,221, filed May 14, 2009.
First Office Action in Chinese patent application No. 201180033855.9, issued on Apr. 1, 2014; 19 pages.
Second Office Action in related Chinese Patent Application No. 201180033855.9, mailed on Nov. 19, 2014; 8 pages.
First Office Action in related Korean Patent Application No. 10-2012-7033164, mailed on Oct. 6, 2014; 16 pages.
International Search Report & Written Opinion in related international patent application No. PCT/US14/35812, mailed on Sep. 5, 2014; 7 pages.

\* cited by examiner

FIG. 1

PRIOR ART

FIG. 2

PRIOR ART

LINEAR BATCH CHEMICAL VAPOR DEPOSITION SYSTEM

FIELD OF THE INVENTION

The invention relates generally to a system and method for chemical vapor deposition. More particularly, the invention relates to a chemical vapor deposition system for linear batch processing of substrates.

BACKGROUND OF THE INVENTION

Chemical vapor deposition (CVD) is a process frequently used to deposit semiconductor, dielectric, metallic and other thin films onto a surface of a substrate. In one common CVD technique, one or more precursor molecules, each in a gas phase, are introduced into a process chamber that includes the substrate. The reaction of these precursor gases at the surface of the substrate is initiated or enhanced by adding energy. For example, energy can be added by increasing the surface temperature of the substrate or by exposing the surface to a plasma discharge or ultraviolet (UV) radiation source.

The quality of a film deposited by a CVD reaction occurring in the gas phase depends significantly on the uniformity of the precursor gases at the substrate. Non-uniform gas near the substrate surface can yield unsatisfactory film uniformity and can lead to shadowing artifacts due to features on the surface, such as steps and vias. High volume processing of wafers and other substrates is limited by known systems and methods for CVD processing. Complex rotational mechanisms are often employed and the size of conventional reaction chambers limits the number of substrates per CVD process batch.

SUMMARY OF THE INVENTION

In one aspect, the invention features a linear batch CVD system that includes a deposition chamber, a substrate carrier disposed in the deposition chamber, a showerhead disposed above the substrate carrier, a translation mechanism coupled to the showerhead, and a heating system. The substrate carrier has a plurality of receptacles each configured to receive a planar disc substrate. All of the receptacles have a diameter and are arranged in a single row that is parallel to a length of the deposition chamber to hold the planar disc substrates in a straight line and horizontal coplanar configuration. The showerhead has a plurality of gas injectors. Each gas injector has a port in the shape of a linear slot having a length that is greater than the diameters of the receptacles. Each linear slot is parallel to the linear slots of the other gas injectors and parallel to the single row of receptacles. Each gas injector supplies a different gas through the respective one of the ports toward the substrate carrier. The translation mechanism is configured to move the showerhead over the substrate carrier in a direction perpendicular to the single row of receptacles. The heating system includes at least one heating element and a heating control module for uniformly controlling a temperature of the substrates.

In another aspect, the invention features a linear batch CVD system that includes a deposition chamber, a substrate carrier disposed in the deposition chamber, a showerhead disposed above the substrate carrier, a translation mechanism coupled to the showerhead, a film thickness sensor, a temperature sensor and a heating system. The deposition chamber has a wall with a window. The substrate carrier has a plurality of receptacles each configured to receive a planar disc substrate. All of the receptacles have a diameter and are arranged in a single row that is parallel to a length of the deposition chamber to hold the planar disc substrates in a straight line and horizontal coplanar configuration. The showerhead has a plurality of gas injectors. Each gas injector has a port in the shape of a linear slot having a length that is greater than the diameters of the receptacles. Each linear slot is parallel to the linear slots of the other gas injectors and parallel to the single row of receptacles. Each gas injector supplies a different gas through the respective one of the ports toward the substrate carrier. The translation mechanism is configured to move the showerhead over the substrate carrier in a direction perpendicular to the single row of receptacles. The film thickness sensor is configured to acquire film thickness data for a planar disc substrate. The film thickness sensor is disposed above one of the planar disc substrates with the window of the deposition chamber therebetween. The temperature sensor is configured to acquire temperature data for one of the planar disc substrates. The heating system includes at least one heating element and a heating control module for uniformly controlling a temperature of the planar disc substrates.

BRIEF DESCRIPTION OF THE DRAWINGS

The above and further advantages of this invention may be better understood by referring to the following description in conjunction with the accompanying drawings, in which like numerals indicate like structural elements and features in the various figures. For clarity, not every element may be labeled in every figure. The drawings are not necessarily to scale, emphasis instead being placed upon illustrating the principles of the invention.

DETAILED DESCRIPTION

The steps of the methods of the present invention can be performed in any order with operable results and two or more steps can be performed simultaneously unless otherwise noted. Moreover, the systems and methods of the present invention may include any of the described embodiments or combinations of the described embodiments in an operable manner.

The present teaching relates to systems and methods for reactive gas phase processing such as CVD, MOCVD and Halide Vapor Phase Epitaxy (HVPE) processes. In conventional reactive gas phase processing of semiconductor materials, semiconductor wafers are mounted in a carrier inside a reaction chamber. A gas distribution injector is configured to face the carrier. The injector typically includes gas inlets that receive a plurality of gases or combinations of gases. The injector directs the gases or combination of gases to the reaction chamber. Injectors commonly include showerhead devices arranged in a pattern that enables the precursor gases to react as close to each wafer surface as possible to maximize the efficiency of the reaction processes and epitaxial growth at the surface.

Some gas distribution injectors include a shroud to assist in providing a laminar gas flow during the CVD process. One or more carrier gases can be used to assist in generating and maintaining the laminar gas flow. The carrier gases do not react with the precursor gases and do not otherwise affect the CVD process. A typical gas distribution injector directs the precursor gases from the gas inlets to targeted regions of the reaction chamber where the wafers are processed. For example, in some MOCVD processes the gas distribution injector introduces combinations of precursor gases including metal organics and hydrides into the reaction chamber. A carrier gas such as hydrogen or nitrogen, or an inert gas such as argon or helium, is introduced into the chamber through the injector to help sustain a laminar flow at the wafers. The precursor gases mix and react within the chamber to form a film on the wafers.

In MOCVD and HVPE processes, the wafers are typically maintained at an elevated temperature and the precursor gases are typically maintained at a lower temperature when introduced into the reaction chamber. The temperature of the precursor gases and thus their available energy for reaction increases as the gases flow past the hotter wafers.

Figure 1:
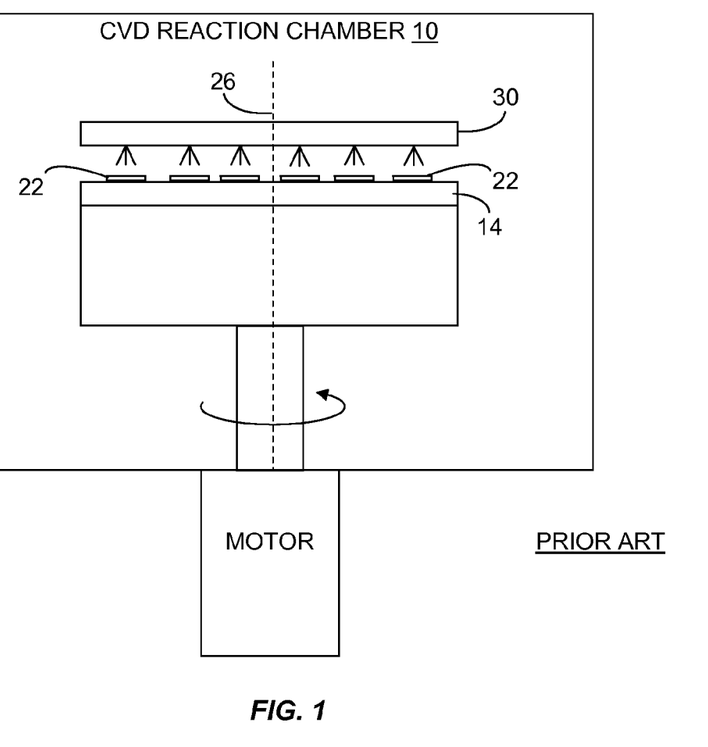
FIG. 1 is an illustration of a CVD reaction chamber as is known in the art.
Figure 2:
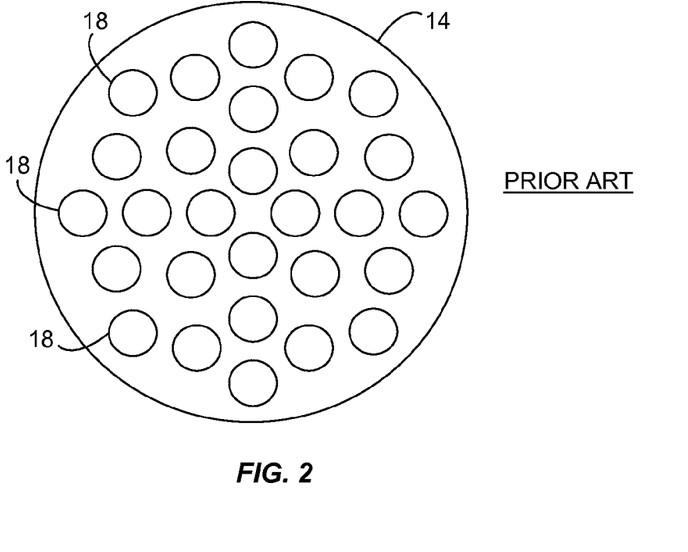
FIG. 2 is an illustration of the wafer carrier of FIG. 1.

One common type of CVD reaction chamber 10 is shown in FIG. 1. The chamber 10 includes a disc shaped wafer carrier 14 shown in an unpopulated state in more detail in FIG. 2. The carrier 14 has pockets 18 or other structural features arranged to hold one or more wafers 22 on a top surface. During CVD processing, the carrier 14 rotates about a vertical axis (dashed line 26) that extends perpendicular to the wafer-bearing surface and each wafer 22 is rotated about a wafer axis that is centered on and perpendicular to the wafer surface to achieve planetary motion. Rotation of the carrier 14 and wafers 22 improves the uniformity of the deposited material. During rotation, the precursor gases are introduced into the reaction chamber 10 from a flow inlet element 30 above the carrier 14. The flowing gases pass downward toward the wafers 22, preferably in a laminar plug flow. As the gases approach the rotating carrier 14, viscous drag impels the gases into rotation about the axis 26. Consequently, in a boundary region near the carrier surface and wafers 22, the gases flow around the axis 26 and outward toward the edge of the carrier 14. The gases flow past the carrier edge and then downward toward one or more exhaust ports. Typically, MOCVD process are performed using a succession of different precursor gases and, in some instances, different wafer temperatures, to deposit a plurality of different layers each having a different composition to form a device.

CVD processes are typically limited in batch capacity. For example, achieving uniformity of the deposited film for all substrates in a conventional CVD reaction chamber (e.g., chamber 10 in FIG. 1) is generally difficult, especially as the size of the reaction chamber increases to allow for more substrates to be processed or to accommodate larger substrates. Conventional systems and methods for CVD processing are often inadequate to support high volume processing of wafers and other substrates without sacrificing uniformity of the deposited films or requiring redundant equipment.

The systems and methods of the present invention are suitable for high volume batch CVD processing of substrates. The narrow width of the reaction chamber of the systems enables a uniform distribution of the precursor gases across the substrates along the entire length of the chamber. The number of substrates that can be coated with uniform film thickness and composition during a single CVD process run is scalable and can be substantially larger than the number of substrates processed in a typical CVD reaction chamber. Moreover, complicated motion mechanisms are not required and each substrate is simply rotated about a single substrate axis.

Figure 3A:
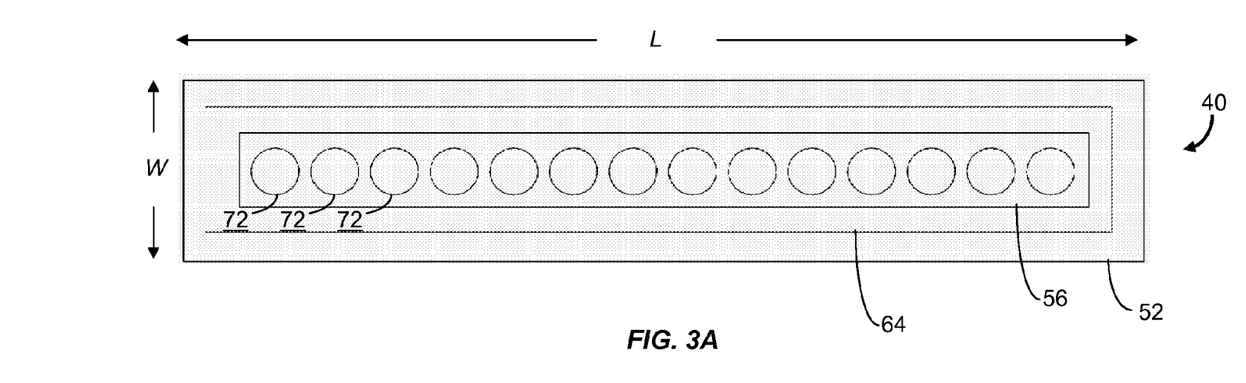
FIG. 3A and FIG. 3B show a top view and a side view, respectively, of one embodiment of a linear batch CVD system according to the invention.
Figure 3B:
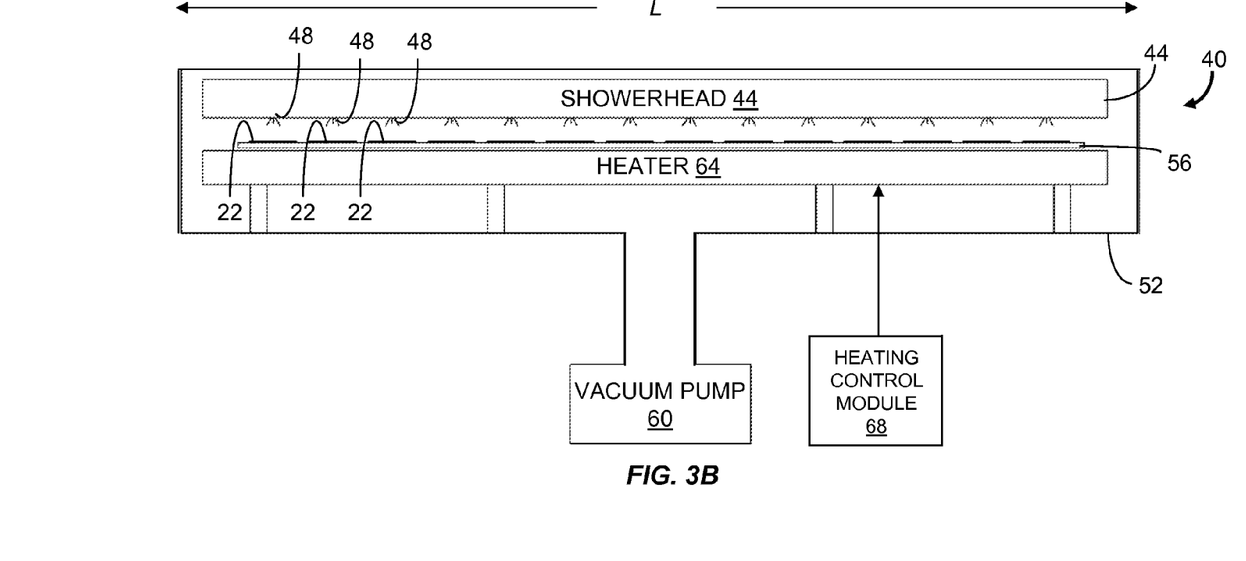

FIG. 3A and FIG. 3B are top and side views, respectively, of an embodiment of a linear batch CVD system 40 according to the present invention. In FIG. 3A, the top down view is from underneath a shower head 44 structure that includes gas injectors 48 as shown in FIG. 3B. The linear batch CVD system 40 includes a deposition chamber 52, substrate carrier 56, vacuum system 60, the shower head 44 and a heating system that includes a heater 64 and a heating control module 68. The substrate carrier 56 includes a plurality of receptacles 72 each configured to receive a substrate 22. In the embodiments describe herein, the substrate 22 is generally described as a wafer, such as a semiconductor wafer; however, it should be recognized that other forms and types of substrates can be used.

The width W of the deposition chamber 52 is substantially narrower than the length L and accommodates only a single row of wafers 22. Although the row is shown as a straight line, the invention contemplates other types of rows in which the wafers 22 are arranged in a curved line or other shape so that the dimension perpendicular to the row at any location is substantially less than the length of the row. For example, the linear configuration can include a batch of wafers 22 arranged along a straight line, a curved line, or any combination of straight line segments and curved line segments. The narrow dimension of the configuration enables a uniform distribution of precursor gases across all the wafers 22 in the batch.

In preparation for a CVD process run, wafers 22 are loaded into respective receptacles 72 in the substrate carrier 56. Loading is preferably performed in an automated manner, for example, by retrieving the wafers 22 from a wafer supply and positioning each wafer 22 into its receptacle 72 using one or more robotic mechanisms disposed near one side of the deposition chamber 52. Similarly, processed wafers 22 can be removed from the receptacles using robotic means.

Figure 4A:
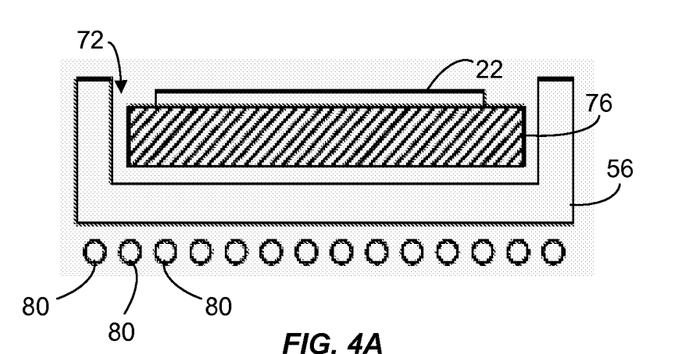
FIG. 4A shows a cross-sectional view through one of the receptacles of the substrate carrier of FIG. 3A and FIG. 3B.

FIG. 4A is a cross-sectional view of the substrate carrier 56 through one of the receptacles 72. Each receptacle 72 includes a recessed region to maintain the position of the wafers 22 within the carrier 56. As illustrated, the wafer 22 is disposed on an intermediate substrate carrier 76 that resides in the receptacle 72. The heater 64 includes a plurality of heating elements 80 positioned near the bottom of the substrate carrier 56 and arranged substantially parallel to the length of the carrier 56. For example, the heating elements 80 may be wires or filament heaters that generate heat while conducting an electrical current. Alternatively, the heating elements 80 may be lamp heaters or RF heaters.

Heat is coupled from the heating elements 80 to the substrate carrier 56 via radiative coupling. In one embodiment, the substrate carrier 56 comprises graphite or another material having a high thermal conductivity to efficiently conduct heat to the wafers 22. Preferably, the heating elements 80 are independently controlled, or are controlled as subsets of the total number of elements. Individual element control or group control allows temperature variations due to radiation loss from the sides of the substrate carrier 56 to be compensated by applying greater heat near the sides of the carrier 56. In an alternative embodiment, the heating elements 80 do not extend the length of the carrier 56, but are instead arranged in zones of shorter lengths that together span nearly the full length of the deposition chamber. The shorter heating zones may be independently controlled in response to temperature measurements at different locations along the length of the deposition chamber to achieve a more uniform temperature environment.

Figure 4B:
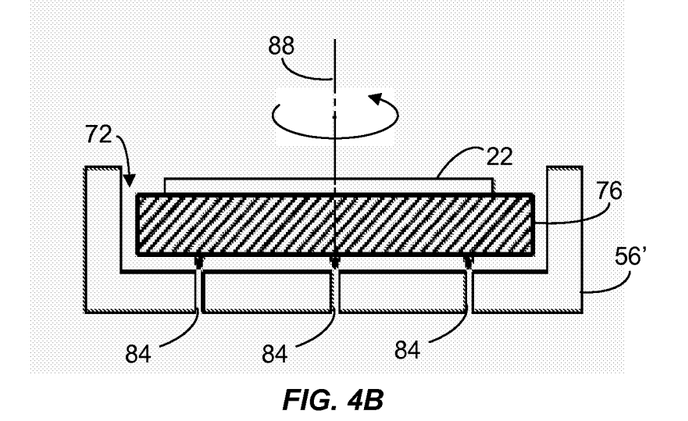
FIG. 4B shows a cross-sectional view of an alternative substrate carrier according to another embodiment of the invention.
Figure 4C:
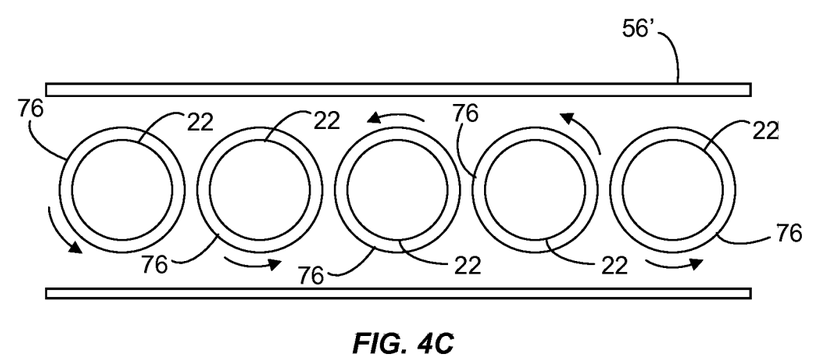
FIG. 4C is a top view of the substrate carrier of FIG. 4B showing rotation of the wafers about a substrate axis.

FIG. 4B illustrates a cross-sectional view of a substrate carrier 56' according to another embodiment. Each receptacle 72 in the substrate carrier 56' has a plurality of air injector channels 84 that, when active, allow gas to flow upward to provide an air bearing support that floats the intermediate substrate carrier 76 and wafer 22. At least some of the air injector channels 84 in each receptacle 72 are configured at a non-zero angle with respect to the vertical axis 88 to impart a rotation to the intermediate substrate carrier 76 about the vertical axis 88 so that each intermediate carrier 76 and wafer 22 rotate as shown in FIG. 4C.

Referring again to FIG. 3B, in various embodiments the CVD system 40 includes one or more sensors to sense the temperature across the wafers. Temperature sensors communicate with the heating control module 68 to enable more accurate control of the wafer temperatures. The temperature sensor can be a pyrometer or other sensor adapted for determining the high temperatures of the wafers 22 during the CVD process. Alternatively, one or more thermocouples disposed on the substrate carrier 56 communicate with the heating control module 68 to provide a feedback signal to enable accurate control of the wafer temperatures.

In another embodiment, the CVD system 40 includes one or more film thickness sensors to determine the thickness of the films being deposited on the wafers 22. The film thickness sensor can be an optical reflectometer or similar measurement system as known in the art.

A temperature sensor and film thickness sensor can be integrated in a single measurement head used to monitor conditions during a CVD process. In one embodiment, a plurality of measurement heads are positioned along the length L of the deposition chamber 52 to obtain temperature and thickness data for a subset of the total number of wafers 22, for example, the measurement heads can be positioned to obtain data for every third wafer 22 in the linear configuration. In an alternative embodiment, a single measurement head having a temperature sensor and a film thickness sensor is mounted to a translation mechanism, such as a linear drive, that enables the measurement head to be moved along the length L of the deposition chamber 52. A window above each wafer 22 enables the moving head to obtain data for each wafer 22. The wafer measurements are used to control the heater 64 and the precursor gas flows.

The showerhead 44 provides a uniform distribution of the precursor gases at the surface of each wafer 22. In a two precursor gas system, the showerhead 44 includes one or more gas injectors for each precursor gas. By way of an example, the precursor gases in a two precursor gas implementation can include trimethylgallium (TMG) and ammonia gases used in the production of gallium nitride (GaN) light-emitting diodes (LEDs).

In some CVD applications where film growth is determined by surface reactions, it is preferable to sequentially activate, or pulse, the precursor gases so that substantially only one gas is present in the deposition chamber 52. Pulsing of the precursor gases in this manner limits the mixing of the gases in the chamber and reduces or eliminates parasitic deposition.

Figure 5:
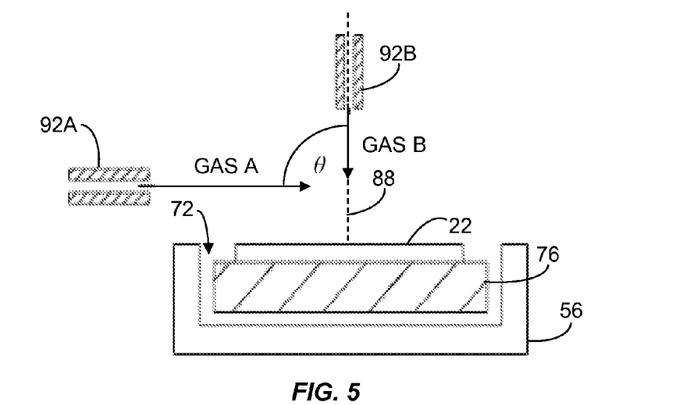
FIG. 5 is a cross-sectional view through a wafer and substrate carrier showing a side view of two injector ports arranged in a perpendicular configuration according to one embodiment of the invention.

FIG. 5 is a cross-sectional view through a receptacle 72 and wafer 22 showing a side view of two injector ports (slots 92 extending into page) arranged in a perpendicular configuration ($\theta=90°$) according to one embodiment. One slot 92A provides a precursor gas (gas "A") in a horizontal flow that is substantially parallel to the wafer surface. The other slot 92B provides a different precursor gas (gas "B") in a vertical flow that is substantially parallel to the axis 88 of the wafer 22. In alternative embodiments, the angle theta between the injector slots 92 is configured to be at a different value in a range from $\theta=0°$ (side by side horizontal flow configuration) to $\theta=90°$.

Figure 6:
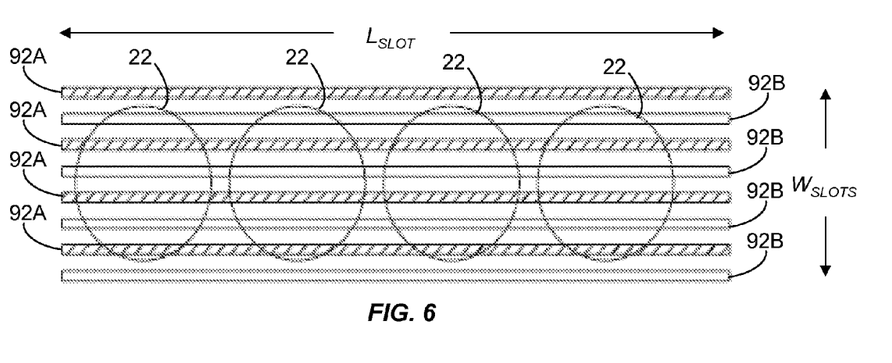
FIG. 6 shows a top view of an arrangement of injector ports according to one embodiment of the invention.

FIG. 6 shows a top view of an arrangement of injector ports 92 with respect to four adjacent substrates 22 according to another embodiment. Each injector port 92 is in the form of a slot, or substantially rectangular opening, and has a length $L_{SLOT}$ that extends parallel to the length L of the deposition chamber 52 (see FIG. 3A). The width $W_{SLOTS}$ of the full arrangement of slots 92 is greater than the diameter of the substrates 22. Precursor gas A is supplied from slots 92A that are spaced in alternating arrangement with slots 92B that supply precursor gas B.

In one embodiment, the lengths $L_{SLOT}$ of the slots 92 are nearly as long as the length of the deposition chamber. In alternative embodiments, the slots 92 are configured in two or more groups so that the lengths $L_{SLOT}$ of the slots 92 in a group is substantially less than the length of the deposition chamber. Injector port grouping is preferable in some configurations having a high batch capacity to enable more uniform precursor gas distribution across the narrow dimension of the deposition chamber. By way of example, the lengths $L_{SLOT}$ of slots in a group can be one meter for a deposition chamber that is several meters in length. In some embodiments, the spacing between adjacent wafers 22 in neighboring groups may exceed the spacing between wafers 22 within the same port group. The precursor gas flows for each group can be independently controlled to enable more uniform deposition of films for the full batch of wafers 22 in the deposition chamber.

Figure 7:
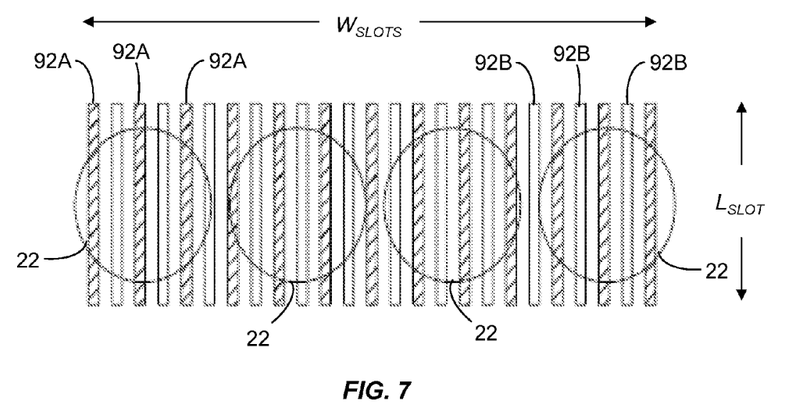
FIG. 7 shows a top view of an arrangement of injector ports according to another embodiment of the invention.

FIG. 7 shows a top view of an alternative embodiment to the slots 92 illustrated in FIG. 6. Each slot 92 has a length $L_{SLOT}$ that extends parallel to the shorter dimension (i.e., the width W shown in FIG. 3A) of the deposition chamber and is greater than the diameters of the wafers 22. The slots 92A and 92B are arranged in alternating position along the length of the deposition chamber. In one embodiment, the full width $W_{SLOTS}$ of the configuration of slots 92 is nearly the length of the deposition chamber. In some alternative embodiments, the slots 92 are arranged in groups each having a group width that is substantially less than the length of the deposition chamber. The spacing between adjacent wafers 22 belonging to neighboring slot groups can exceed the spacing between wafers 22 within a slot group. The gas flow for injector ports in the slot groups can be independently controlled to improve the uniformity of film deposition for all wafers 22 in the deposition chamber.

Figure 8A:
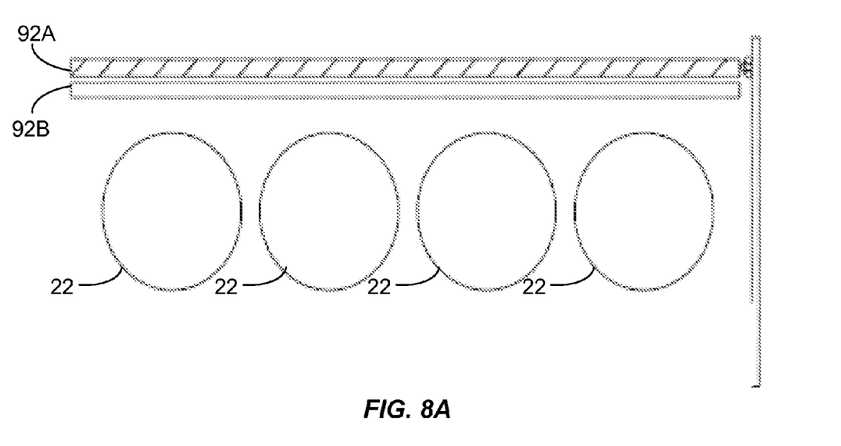
FIG. 8A, FIG. 8B and FIG. 8C show top views of an arrangement of injector ports at various positions according to another embodiment of the invention.
Figure 8B:
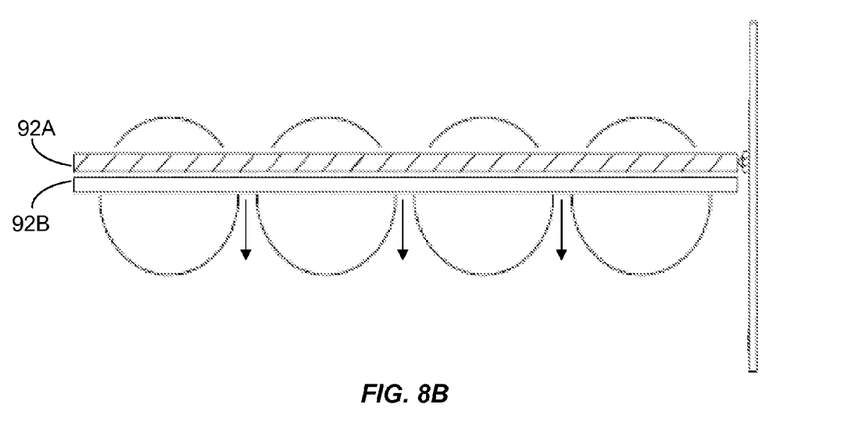
Figure 8C:
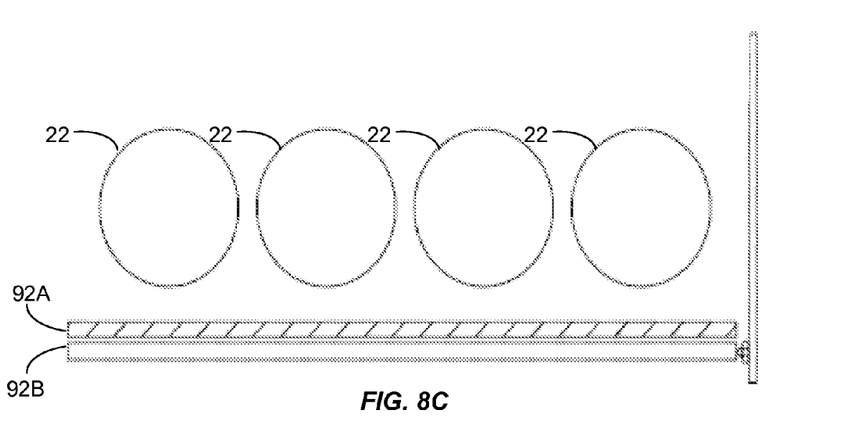

For the gas injector configurations described above, each precursor gas is supplied to the deposition chamber through multiple ports. FIG. 8A shows an alternative configuration in which a single pair of injector ports (i.e., a "port pair") includes one slot 92A to supply precursor gas A and a second slot 92B to supply precursor gas B. During a CVD process run, the port pair is swept in a back and forth motion above the wafers 22 using a translation mechanism such as a single-axis translation stage. For example, the port pair moves from one side of the row of wafers 22 as shown in FIG. 8A, through intermediate positions (for example, as shown in one intermediate position in FIG. 8B), until it reaches a position at the opposite side of the row of wafers 22 as shown in FIG. 8C. The port pair is then translated in a reverse direction until it returns to the position shown in FIG. 8A. The motion of the port pair is repeated in a cyclical manner throughout the CVD process run.

Figure 9:
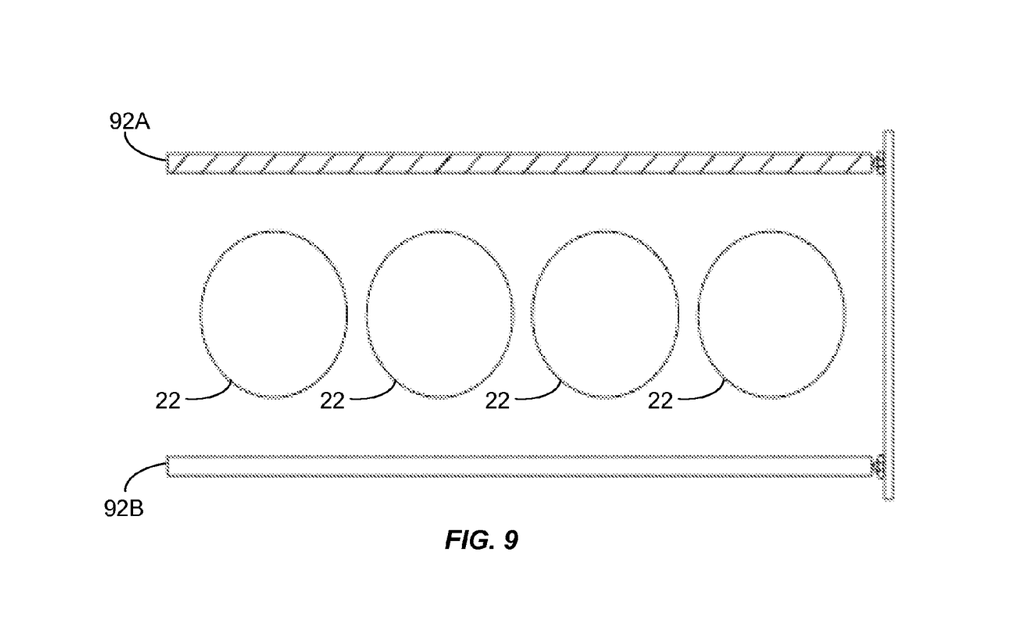
FIG. 9 shows a configuration of injector ports according to another embodiment of the invention.

FIG. 9 shows a configuration of gas injectors according to another embodiment in which one slot 92A that supplies precursor gas A is on an opposite side of the row of wafers 22 from another slot 92B that supplies precursor gas B. During a CVD process run the first slot 92A moves from the illustrated position across the row of wafers 22 until it is adjacent to the second slot 92B. The first slot 92A then translates in a reverse direction until it returns to the illustrated position. The second slot 92B remains stationary when the first slot 92A is in motion.

Once the first slot 92A completes its round trip motion, the second slot 92B is moved from its illustrated position across the row of wafers 22 until it is adjacent to the first slot 92A. The second slot 92B then reverses direction and moves across the wafers 22 until it reaches its illustrated position. The first slot 92A remains stationary while the second slot is in motion. This alternating motion in which the first slot 92A moves and then the second slot 92B moves is repeated throughout the CVD process. In a preferred embodiment, the two precursor gases supplied by the slots 92 are sequentially pulsed so that gas is supplied from a slot only when the slot is in motion so that parasitic deposition is substantially reduced.

Other variations of the phasing of the cyclic motions of the two slots 92 will be apparent to those of skill in the art. For example, one slot 92 may begin its motion before the other slot 92 completes its motion as long as the slots do not interfere with each other.

In the various embodiments described above with respect to FIG. 5 to FIG. 9, the gas injectors include ports 92 that are substantially rectangular or slotted; however, other forms of gas injectors are contemplated. For example, the gas injectors can be in the form of injector tubes uniformly distributed over the substrate carrier 56. Ports can be any of a variety of openings such as holes or various shaped apertures through a sidewall of the tube facing the substrate carrier 56.

Figure 10:
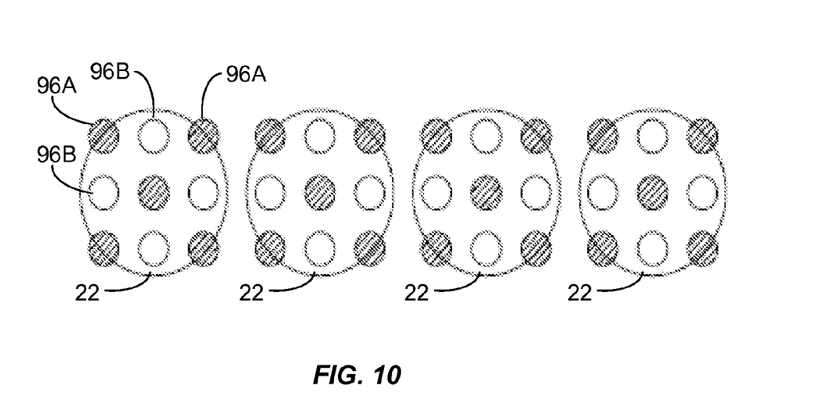
FIG. 10 shows a top view of injector nozzles according to one embodiment of the invention.

FIG. 10 is a top view relating to another embodiment and shows a configuration of injector nozzles 96 with respect to four adjacent wafers 22. The number of nozzles 96 above each wafer 22 may be different and only nine nozzles are shown with each wafer 22 for clarity. Some nozzles 96A supply a first precursor gas (e.g., gas A) and the other nozzles 96B supply a second precursor gas (e.g., gas B) so that a substantially uniform distribution of each gas is present near and at the surface of each wafer 22. In some embodiments, the nozzles 96 are controlled in subsets, or groups, defined for zones for subsets of the total number of wafers 22 arranged along the length of the deposition chamber.

While the invention has been shown and described with reference to specific embodiments, it should be understood by those skilled in the art that various changes in form and detail may be made therein without departing from the spirit and scope of the invention as recited in the accompanying claims.

What is claimed is:

1. A linear batch chemical vapor deposition (CVD) system comprising:
   a deposition chamber;
   a substrate carrier disposed in the deposition chamber and having a plurality of receptacles each configured to receive a planar disc substrate, all of the receptacles in the substrate carrier having a diameter and being arranged in a single row that is parallel to a length of the deposition chamber to hold the planar disc substrates in a straight line and horizontal coplanar configuration;
   a showerhead disposed above the substrate carrier and having a plurality of gas injectors, each of the gas injectors having a port in the shape of a linear slot having a length that is greater than the diameters of the receptacles, each of the linear slots being parallel to the linear slots of the other gas injectors and parallel to the single row of receptacles, each of the gas injectors supplying a different gas through the respective one of the ports toward the substrate carrier;
   a translation mechanism coupled to the showerhead and configured to move the showerhead over the substrate carrier in a direction perpendicular to the single row of receptacles; and
   a heating system comprising at least one heating element and a heating control module for uniformly controlling a temperature of the planar disc substrates.

2. The linear batch CVD system of claim 1 wherein the gas is a precursor gas for a CVD process.

3. The linear batch CVD system of claim 1 further comprising an intermediate substrate carrier disposed in each of the receptacles and wherein each receptacle comprises a plurality of air injector channels to float and rotate a respective one of the intermediate substrate carriers and planar disc substrates about a substrate axis.

4. The linear batch CVD system of claim 3 further comprising, for each of the receptacles, an intermediate substrate carrier configured to be received by the receptacle, wherein each intermediate substrate carrier and a respective one of the planar disc substrates float and rotate about the substrate axis when the air injector channels are active.

5. The linear batch CVD system of claim 1 further comprising a translation mechanism to move the slots in a direction perpendicular to the lengths of the substrate carriers.

6. The linear batch CVD system of claim 1 wherein the gases are sequentially pulsed.

7. The linear batch CVD system of claim 1 wherein the heating element is a filament heater.

8. The linear batch CVD system of claim 1 wherein the heating element is a lamp heater.

9. The linear batch CVD system of claim 1 wherein the heating element is an RF heater.

10. The linear batch CVD system of claim 1 wherein the heating system further comprises a temperature sensor in communication with the heating control module and wherein the heating control module controls the temperature of the planar disc substrates in response to a sensed temperature.

11. The linear batch CVD system of claim 10 wherein the temperature sensor is a pyrometer.

12. The linear batch CVD system of claim 1 further comprising a reflectometer to determine a film thickness based on a reflectance of a substrate and to generate a signal for controlling the film thickness during a CVD process.

13. The linear batch CVD system of claim 10 further comprising a translation mechanism having the temperature sensor mounted thereto, the translation mechanism configured to translate the temperature sensor parallel to the single row of planar disc substrates to measure a temperature of at least two of the planar disc substrates.

14. The linear batch CVD system of claim 12 further comprising a translation mechanism having the reflectometer mounted thereto, the translation mechanism configured to translate the reflectometer parallel to the single row of planar disc substrates to determine a film thickness of at least two of the planar disc substrates based on a reflectance of the at least two planar disc substrates.

15. The linear batch CVD system of claim 1 wherein the planar disc substrates are semiconductor wafers.

16. A linear batch chemical vapor deposition (CVD) system comprising:
- a deposition chamber having a wall with a window therein;
- a substrate carrier disposed in the deposition chamber and having a plurality of receptacles each configured to receive a planar disc substrate, all of the receptacles in the substrate carrier having a diameter and being arranged in a single row that is parallel to a length of the deposition chamber to hold the planar disc substrates in a straight line and horizontal coplanar configuration;
- a showerhead disposed above the substrate carrier and having a plurality of gas injectors, each of the gas injectors having a port in the shape of a linear slot having a length that is greater than the diameters of the receptacles, each of the linear slots being parallel to the linear slots of the other gas injectors and parallel to the single row of receptacles, each of the gas injectors supplying a different gas through the respective one of the ports toward the substrate carrier;
- a translation mechanism coupled to the showerhead and configured to move the showerhead over the substrate carrier in a direction perpendicular to the single row of receptacles;
- a film thickness sensor to acquire film thickness data for a planar disc substrate, the film thickness sensor disposed above one of the planar disc substrates with the window of the deposition chamber therebetween;
- a temperature sensor configured to acquire temperature data for one of the planar disc substrates; and
- a heating system comprising at least one heating element and a heating control module for uniformly controlling a temperature of the planar disc substrates.

17. The linear batch CVD system of claim 16 wherein the film thickness sensor and temperature sensor are integrated as a single measurement head.

18. The linear batch CVD system of claim 17 further comprising a linear drive translation mechanism configured for translation along an axis parallel to the length of the deposition chamber and wherein the single measurement head is mounted to the linear drive translation mechanism to enable acquisition of temperature and thickness data for each of the planar disc substrates.

19. The linear batch CVD system of claim 1 wherein the translation mechanism is a translation stage configured to move the showerhead in a forward direction and in a reverse direction perpendicular to the single row of receptacles.

* * * * *